United States Patent
Wei et al.

(10) Patent No.: US 10,411,188 B2
(45) Date of Patent: Sep. 10, 2019

(54) MASK PLATE FOR VAPOR DEPOSITION OF ORGANIC LIGHT-EMITTING DIODE (OLED) DEVICES AND OLED DEVICE THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Feng Wei, Guangdong (CN); Liang Jiang, Guangdong (CN); Jinchuan Li, Guangdong (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/576,582

(22) PCT Filed: Nov. 10, 2017

(86) PCT No.: PCT/CN2017/110307
§ 371 (c)(1),
(2) Date: Nov. 22, 2017

(87) PCT Pub. No.: WO2019/051977
PCT Pub. Date: Mar. 21, 2019

(65) Prior Publication Data
US 2019/0081240 A1 Mar. 14, 2019

(30) Foreign Application Priority Data
Sep. 12, 2017 (CN) .......................... 2017 1 0816354

(51) Int. Cl.
*H01L 29/08* (2006.01)
*H01L 51/00* (2006.01)
(Continued)

(52) U.S. Cl.
CPC ........ *H01L 51/0011* (2013.01); *C23C 14/042* (2013.01); *H01L 27/3246* (2013.01);
(Continued)

(58) Field of Classification Search
CPC .................................................. H01L 51/0011
(Continued)

(56) References Cited

U.S. PATENT DOCUMENTS 5,115,296 A * 5/1992 Hsue ................. H01L 21/02238
257/333
2015/0349037 A1 12/2015 Kang et al.
2016/0365532 A1 12/2016 Song et al.

FOREIGN PATENT DOCUMENTS

| CN | 1535085 A | 10/2004 |
| CN | 104659063 A | 5/2015 |
| CN | 104701338 A | 6/2015 |

* cited by examiner

*Primary Examiner* — Ajay Arora
(74) *Attorney, Agent, or Firm* — Hauptman Ham, LLP

(57) ABSTRACT

A mask plate for vapor deposition of an organ light-emitting diode (OLED) device and an OLED device manufactured thereby are provided. The mask plate has first slot-type mask portions disposed at intervals along a predetermined direction; second slot-type mask portions disposed at intervals along a direction perpendicular to the first slot-type mask portion and pixel regions into at least two displaying regions with the first slot-type mask portion. An intersection portion formed by the first slot-type mask portion and the second slot-type mask portion covers a connection hole connected to an auxiliary cathode.

6 Claims, 2 Drawing Sheets

(51) Int. Cl.
    *H01L 27/32*     (2006.01)
    *C23C 14/04*     (2006.01)
    *H01L 51/52*     (2006.01)
    *H01L 51/56*     (2006.01)

(52) U.S. Cl.
    CPC ........ *H01L 51/001* (2013.01); *H01L 51/5228* (2013.01); *H01L 51/56* (2013.01)

(58) Field of Classification Search
    USPC .......................................................... 257/40
    See application file for complete search history.

MASK PLATE FOR VAPOR DEPOSITION OF ORGANIC LIGHT-EMITTING DIODE (OLED) DEVICES AND OLED DEVICE THEREOF

FIELD OF THE INVENTION

The present invention relates to fields of displaying technologies, especially to a mask plate for vapor deposition of organic light-emitting diode (OLED) devices and an OLED device manufactured thereby.

BACKGROUND OF THE INVENTION

Organic light-emitting diode (OLED) display panels have advantages of low power consumption, small dimension, thinness, wide viewing angles, etc., are extensively used, and are recognized as superior display devices of next generation industries. OLED display applications in the terminal TV markets will be widespread as time passes.

Primary technology of large-sized white OLED (WOLED) devices is Bottom-OLED technology, designs of the Bottom-OLED technology have low aperture ratios and cannot satisfy high resolution requirements in the market. Therefore, a Top-OLED technology for WOLEDs has been developed. Designs of the Top-OLED technology have advantages such as high resolution, excellent optical effect by transparent cathodes, etc. However, because they are limited by manufacturing equipment and process, each layer of a WOLED and the cathode employ an open mask to form an entire surface of coating, issues of voltage sag of the WOLED device and non-uniform displaying of the display panel are un-ignorable.

As described above, in a conventional OLED device, each coating layer of the OLED device employs an open mask plate for coating deposition. However, organic material for deposition blocks connection holes and causes a cathode to be unable to be connected to an auxiliary cathode, such that voltage sage of the electrode and displaying uniformness of the display panel are affected to further influence performance of the OLED device.

SUMMARY OF THE INVENTION

The present invention provides a mask plate for vapor deposition of organic light-emitting diode (OLED) device and an OLED device manufactured thereby that prevent organic material deposited in advance from blocking a connection hole and assure effective connection between a cathode and an auxiliary cathode such that voltage sag of the OLED device and displaying uniformness of the display panel are effectively improved, and the performance of the OLED device is further increased.

To solve the abovementioned issues, the present invention provides technologic solutions as follows.

The present invention provides a mask plate for vapor deposition of an OLED device comprising:

multiple first slot-type mask portions disposed at intervals along a predetermined direction;

multiple second slot-type mask portions disposed at intervals along a direction perpendicular to the predetermined direction of the first slot-type mask portion;

the first slot-type mask portions and the second slot-type mask portions dividing pixel regions corresponding to a substrate into at least two displaying regions, wherein the displaying regions are coating regions of an organic film of the OLED device on the substrate; and the first slot-type mask portions and the second slot-type mask portions configured to cover non-coating regions of the substrate;

wherein two of the first slot-type mask portions and two of the second slot-type mask portions form an outer edge frame of the mask plate, intersection portions are formed by the first slot-type mask portions and the second slot-type mask portions, except for the intersection portions corresponding to the outer edge frame, the remaining intersection portions respectively cover connection holes connected to auxiliary cathodes.

According to a preferred embodiment of the present invention, a width of the first slot-type mask portion is equal to a width of the second slot-type mask portion.

According to a preferred embodiment of the present invention, each of the width of the first slot-type mask portion and the width of the second slot-type mask portion is 3 to 7 microns greater than the connection hole.

According to a preferred embodiment of the present invention, covering regions of the first slot-type mask portions and the second slot-type mask portions are located outside an extent of the displaying regions.

According to a preferred embodiment of the present invention, the first slot-type mask portions and the second slot-type mask portions are located in positions corresponding to pixel partitioning posts, and the covering regions are located in an extent of a region of the pixel partitioning posts.

The present invention further provides an OLED device manufactured by the above mask plate. The OLED device comprises:

a first substrate;

a thin film transistor layer, disposed on a surface of the first substrate and comprising multiple switch units disposed at intervals;

an auxiliary cathode layer disposed on the surface of the first substrate comprising multiple auxiliary cathodes disposed at intervals, and the auxiliary cathodes and the switch unit disposed at intervals;

a pixel defining layer disposed on a surface of the thin film transistor layer and comprising multiple pixel partitioning posts disposed at intervals;

an anode layer disposed on the surface of the thin film transistor layer and located between adjacent two of the pixel partitioning posts;

an organic light-emitting layer disposed on a surface of the anode layer and comprising multiple pixel units;

a cathode layer disposed on a surface of the organic light-emitting layer; and a second substrate disposed opposite to the first substrate;

wherein the cathode corresponding to at least one of the pixel units is connected to a corresponding auxiliary cathode through a connection hole.

According to a preferred embodiment of the present invention, the connection hole comprises a first via located in one of the pixel partitioning posts and a second via located in the thin film transistor layer and corresponding to the first via.

According to a preferred embodiment of the present invention, a diameter of each of the connection holes is 25 to 50 microns.

According to a preferred embodiment of the present invention, the organic light-emitting layer employs a slot-type mask plate to avoid deposition in the connection hole, and the cathode layer employs an open make plate to deposit a metal coating in the connection hole such that the cathode layer is connected to the auxiliary cathode layer.

The present invention also provides a mask plate for vapor deposition of an OLED device, the mask plate comprises:

multiple first slot-type mask portions at intervals along a predetermined direction;

multiple second slot-type mask portions disposed at intervals along a direction perpendicular to the predetermined direction of the first slot-type mask portions;

the first slot-type mask portions and the second slot-type mask portions dividing pixel regions corresponding to a substrate into at least two displaying regions, wherein the displaying regions are coating regions of an organic film of the OLED device on the substrate; and the first slot-type mask portions and the second slot-type mask portions configured to cover non-coating regions of the substrate;

wherein each of intersection portions of the first slot-type mask portions and the second slot-type mask portions covers a connection hole connected to an auxiliary cathode.

According to a preferred embodiment of the present invention, a width of the first slot-type mask portion is equal to a width of the second slot-type mask portion.

According to a preferred embodiment of the present invention, each of the width of the first slot-type mask portion and the width of the second slot-type mask portion is 3 to 7 microns greater than a diameter of each of the connection holes.

According to a preferred embodiment of the present invention, covering regions of the first slot-type mask portions and the second slot-type mask portions are located outside an extent of the displaying regions.

According to a preferred embodiment of the present invention, the first slot-type mask portions and the second slot-type mask portions are located in positions corresponding to pixel partitioning posts, and the covering regions are located in an extent of a region of the pixel partitioning posts.

Advantages of the present invention are as follows. In compared to conventional OLED devices, the OLED device of the present invention employs the design of the auxiliary cathodes that disposes a cathode of a pixel or cathodes of pixels under the OLED device through one or more connection holes for driving compensation. During preparation of the OLED device, the design of a slot-type mask plate for covering the connection holes is applied to cover the connection holes with intersection portions of the slot-type mask plate, which solves the issues of the connection holes blocked during the organic coating deposition process. The cathode coating employs the open mask plate to deposit a metal coating in the connection hole such that the cathode is effectively connected to the auxiliary cathode, which effectively controls the voltage sag of the device and ensures uniform brightness of pixels of the device.

DESCRIPTION OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF THE PREFERRED EMBODIMENTS

Figure 1:
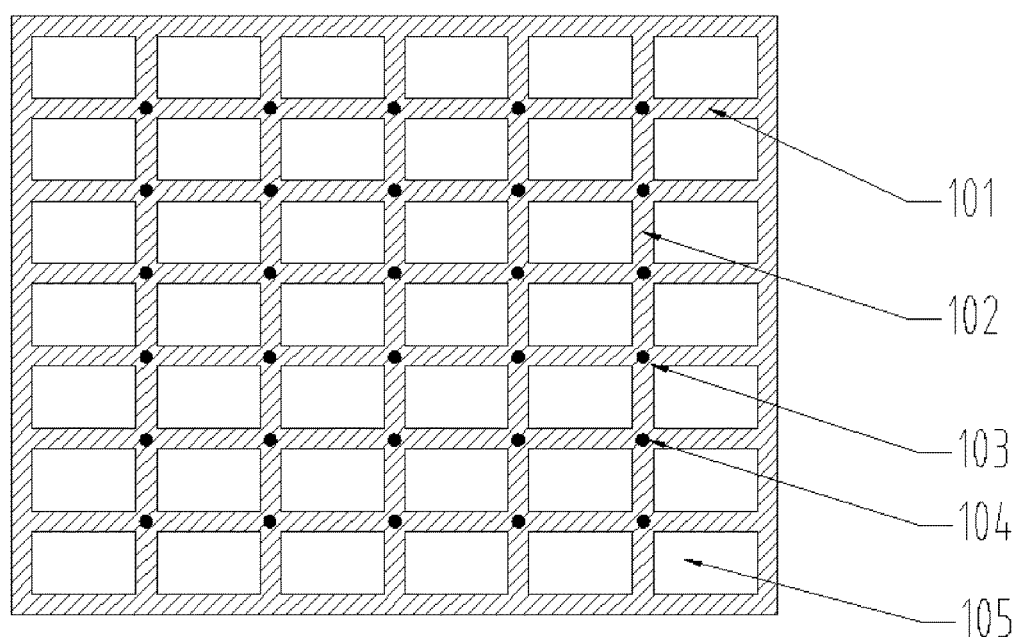
FIG. 1 is a schematic view of a mask plate for vapor deposition of organic light-emitting diode (OLED) devices in accordance with the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface" and etc., only refer to the directions of the appended figures. Therefore, the terminologies of direction are used for explanation and comprehension of the present invention, instead of limiting the present invention. In the figures, units with similar structures are marked with the same reference numerals.

The present invention aims at issues of a conventional organic light-emitting diode (OLED) device in which organic material deposited in advance blocks a connection hole, prevents a cathode from connecting to an auxiliary cathode and thus influences voltage sag of the electrode and displaying uniformness of the display panel to affect performance of the OLED device. The present embodiment can solve the above defects.

With reference to FIG. 1, FIG. 1 is a schematic view of a mask plate for vapor deposition of an OLED device in accordance with the present invention. The mask plate is a slot-type mask plate and comprises: multiple first slot-type mask portions 101 disposed at intervals along a predetermined direction, wherein the predetermined direction may be a horizontal direction; multiple second slot-type mask portions 102 disposed at intervals along a direction perpendicular to the predetermined direction of the first slot-type mask portions 101; the first slot-type mask portions 101 and the second slot-type mask portions 102 dividing pixel regions corresponding to a substrate into at least two displaying regions, wherein the displaying regions are coating regions 105 of an organic film of the OLED device on the substrate; the first slot-type mask portion 101 and the second slot-type mask portion 102 configured to cover non-coating regions of the substrate; wherein a width of the first slot-type mask portion 101 is equal to a width of the second slot-type mask portion 102.

The first slot-type mask portions 101 and the second slot-type mask portions 102 form a mesh structure, each first slot-type mask portion 101 sequentially intersects the second slot-type mask portions 102 to form multiple intersection portions 103. The intersection portions 103 of the first slot-type mask portions 101 and the second slot-type mask portion 102 respectively cover connection holes 104 connected to an auxiliary cathode. A diameter of each of the connection holes 104 is 25 to 50 microns. To effectively cover the connection holes 104, each of the width of the first slot-type mask portion 101 and the width of the second slot-type mask portion 102 is 3 to 7 microns greater than the diameter of the connection hole 104. Covering regions of the first slot-type mask portions 101 and the second slot-type mask portions 102 are located outside the displaying region. Two of the first slot-type mask portions 101 and two of the second slot-type mask portion 102 from an outer edge frame of the mask plate, and portions of the substrate corresponding to the intersection portions 103 of the outer edge frame may be disposed without any connection holes 104.

The present invention, based on actual situations, may dispose a cathode of each pixel or cathodes of pixels to the auxiliary cathode under the OLED device through one or more connection holes 104. Number of the connection hole 104 may depend on actual demand. Therefore, a distance between adjacent two of the first slot-type mask portions 101 and a distance between adjacent two of the second slot-type mask portion 102 may be defined based on a distance of adjacent two of the connection holes 104 of the actual demand such that each of the connection holes 104 is covered with the intersection portion 103.

Figure 2:
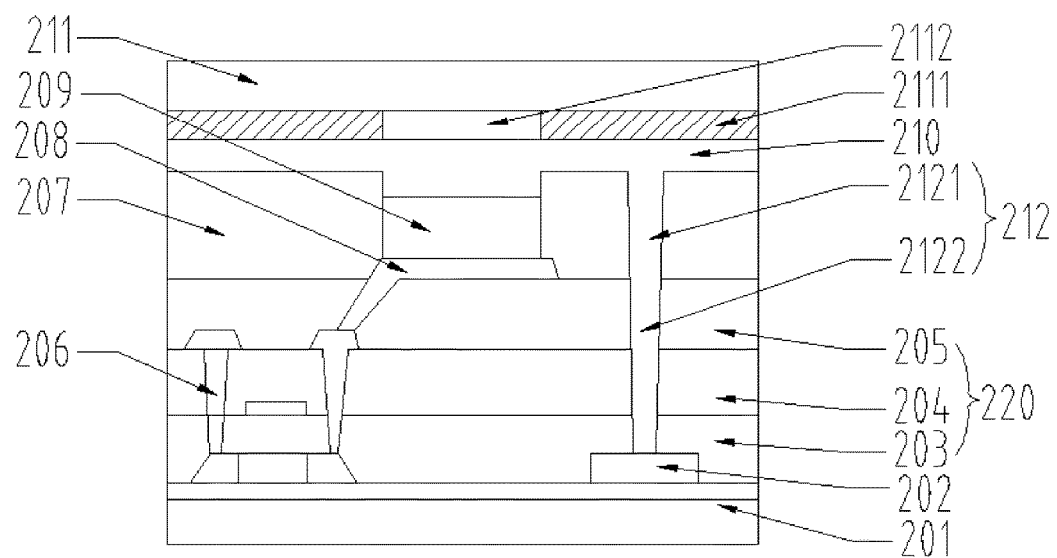
FIG. 2 is a schematic view of an OLED device manufactured by the mask plate in accordance with the present invention.

With reference to FIG. 2, FIG. 2 is a schematic view of an OLED device manufactured by the mask plate of the present invention. The OLED device is a white OLED and comprises: a first substrate 201 coated with a cushioning layer; an auxiliary cathode layer disposed on a surface of the first substrate 201 and comprising multiple auxiliary cathodes 202 disposed at intervals; a thin film transistor layer 220 disposed on the surface of the first substrate 201 and comprising a gate insulating layer 203, an interlayer insulating layer 204, a planarized layer 205 and multiple switch units 206 disposed therethrough at intervals, the gate insulating layer 203 disposed on the surface of the first substrate 201 and surfaces of the auxiliary cathodes 202, the interlayer insulating layer 204 disposed on a surface of the gate insulating layer 203, the planarized layer 205 disposed on a surface of the interlayer insulating layer 204; active layers of the switch units 206 and the auxiliary cathode 202 both disposed on the gate insulating layer 203, and the auxiliary cathodes 202 and the switch units 206 disposed at intervals; a pixel defining layer disposed on a surface of the thin film transistor layer 220 and comprising multiple pixel partitioning posts 207 disposed at intervals and configured to separate different sub-pixel; an anode layer 208 disposed on the surface of the thin film transistor layer 220 between adjacent two of the pixel partitioning posts 207; an organic light-emitting layer 209 disposed on a surface of the anode layer 208 and comprising multiple pixel units; a cathode layer disposed on a surface of the organic light-emitting layer 209 and comprising a cathode 210 corresponding to the pixel units; a second substrate 211, which is a package lid, disposed opposite to the first substrate 201 and comprising a black array 2111 and a color resist layer 2112, and the black array 2111 and the color resist layer 2112 are disposed at intervals.

The cathode 210 corresponding to at least one of the pixel units is connected to a corresponding auxiliary cathode 202 through a connection hole 212. The connection hole 212 comprises a first via 2121 located in one of the pixel partitioning posts 207 and a second via 2122 located in the thin film transistor layer 220 and corresponding to the first via 2121. A diameter of each of the connection holes 212 is 25 to 50 microns. The auxiliary cathode 202, the connection hole 212 and the switch unit 206 are all located right under the black array 2111. The color resist layer 2112 corresponds to the organic light-emitting layer 209. The anode layer 208 is connected to a drain electrode of the switch unit 206. Because the connection hole 212 is adjacent to the organic light-emitting layer 209, during preparation of the OLED device with conventional technologies, the organic light-emitting layer 209 is disposed prior to the cathode 210, and therefore the organic light-emitting layer 209 easily blocks the connection hole 212 such that conduction of the cathode 210 and the auxiliary cathode 202 are influenced.

The organic light-emitting layer 209 of the present invention employs the slot-type mask plate to avoid deposition in the connection hole 212. The cathode 210 employs an open make plate to deposit a metal coating in the connection hole 212 such that the cathode 210 is connected to the auxiliary cathode 202. The first slot-type mask portions and the second slot-type mask portions of the slot-type mask plate are located in positions corresponding to the pixel partitioning posts 207, and covering regions of the first slot-type mask portion and the second slot-type mask portions are located in an extent of a region of the pixel partitioning posts 207. The connection holes 212 are covered by the intersection portions of the first slot-type mask portions and the second slot-type mask portions. The organic light-emitting layer 209 is vapor deposited on a predetermined region through hollow regions defined by the first slot-type mask portions and the second slot-type mask portions. Then, an open make plate is employed to vapor deposit the cathode 210 in the connection hole 212 to ensure that the cathode 210 is successfully connected to the auxiliary cathode 202.

The OLED device of the present invention connects the cathode corresponding to at least one pixel to a corresponding auxiliary cathode through the connection hole for driving compensation such that effective control of voltage sage of the OLED device and uniform brightness of pixels of the OLED device are assured.

In comparison to conventional OLED devices, the OLED device of the present invention employs the design of the auxiliary cathodes that disposes a cathode of a pixel or cathodes of pixels under the OLED device through one or more connection holes for driving compensation. During preparation of the OLED device, the design of a slot-type mask plate for covering the connection holes is applied to cover the connection holes with intersection portions of the slot-type mask plate, which solves the issues of the connection holes blocked during the organic coating deposition process. The cathode coating employs the open mask plate to deposit a metal coating in the connection hole such that the cathode is effectively connected to the auxiliary cathode, which effectively controls the voltage sag of the device and ensures uniform brightness of pixels of the device.

Although the preferred embodiments of the present invention have been disclosed as above, the aforementioned preferred embodiments are not used to limit the present invention. The person of ordinary skill in the art may make various of changes and modifications without departing from the spirit and scope of the present invention. Therefore, the scope of protection of the present invention is defined by the scope of the claims.

What is claimed is:

1. A mask plate for vapor deposition of an organic light-emitting diode (OLED) device, comprising:
   multiple first slot-type mask portions disposed at intervals along a predetermined direction;
   multiple second slot-type mask portions disposed at intervals along a direction perpendicular to the predetermined direction of the first slot-type mask portions;
   the first slot-type mask portions and the second slot-type mask portions dividing pixel regions corresponding to a substrate into at least two displaying regions, wherein the displaying regions are coating regions of an organic film of the OLED device on the substrate; and
   the first slot-type mask portions and the second slot-type mask portions configured to cover non-coating regions of the substrate;
   wherein two of the first slot-type mask portions and two of the second slot-type mask portions form an outer edge frame of the mask plate, intersection portions are formed by the first slot-type mask portions and the second slot-type mask portions, except for intersection portions corresponding to the outer edge frame, and wherein remaining intersection portions respectively cover connection holes connected to auxiliary cathodes, and wherein each of the width of the first slot-type mask portion and the width of the second slot-type mask portion is greater than a diameter of each of the connection holes.

2. The mask plate as claimed in claim 1, wherein, covering regions of the first slot-type mask portions and the second slot-type mask portions are located outside an extent of the displaying regions.

3. The mask plate as claimed in claim 2, wherein the first slot-type mask portions and the second slot-type mask portions are located in positions corresponding to pixel partitioning posts, and the covering regions are located in an extent of a region of the pixel partitioning posts.

4. A mask plate for vapor deposition of an organic light-emitting diode (OLED) device, comprising:
   multiple first slot-type mask portions at intervals along a predetermined direction;
   multiple second slot-type mask portions disposed at intervals along a direction perpendicular to the predetermined direction of the first slot-type mask portions;
   the first slot-type mask portions and the second slot-type mask portions dividing pixel regions corresponding to a substrate into at least two displaying regions, wherein the displaying regions are coating regions of an organic film of the OLED device on the substrate; and
   the first slot-type mask portions and the second slot-type mask portions configured to cover non-coating regions of the substrate;
   wherein each of intersection portions of the first slot-type mask portions and the second slot-type mask portions covers a connection hole connected to an auxiliary cathode,
   wherein each of the width of the first slot-type mask portion and the width of the second slot-type mask portion is greater than a diameter of each of the connection holes.

5. The mask plate as claimed in claim 4, wherein covering regions of the first slot-type mask portions and the second slot-type mask portions are located outside an extent of the displaying regions.

6. The mask plate as claimed in claim 5, wherein the first slot-type mask portions and the second slot-type mask portions are located in positions corresponding to pixel partitioning posts, and the covering regions are located in an extent of a region of the pixel partitioning posts.

* * * * *